United States Patent
Chua et al.

(10) Patent No.: US 10,481,404 B1
(45) Date of Patent: Nov. 19, 2019

(54) RECTANGULAR CAVITY OPTICAL BEAM SHAPER AND METHOD OF MANUFACTURING THE SAME

(71) Applicant: Palo Alto Research Center Incorporated, Palo Alto, CA (US)

(72) Inventors: Christopher L. Chua, San Jose, CA (US); Yu Wang, San Jose, CA (US); David K. Biegelsen, Portola Valley, CA (US); Patrick Yasuo Maeda, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 15/978,420

(22) Filed: May 14, 2018

(51) Int. Cl.
*G02B 27/09* (2006.01)
*H01L 21/311* (2006.01)
*H01L 21/78* (2006.01)
*H01L 21/02* (2006.01)

(52) U.S. Cl.
CPC ..... *G02B 27/0977* (2013.01); *G02B 27/0994* (2013.01); *H01L 21/02595* (2013.01); *H01L 21/31116* (2013.01); *H01L 21/31144* (2013.01); *H01L 21/78* (2013.01)

(58) Field of Classification Search
CPC .......................... G02B 27/0977; G02B 27/0994
See application file for complete search history.

(56) References Cited

U.S. PATENT DOCUMENTS

| | | | | |
|---|---|---|---|---|
| 5,828,505 | A * | 10/1998 | Farmiga | G02B 27/09 359/857 |
| 7,265,906 | B2 * | 9/2007 | Cianciotto | G02B 6/0096 359/618 |
| 2004/0213514 | A1 | 10/2004 | Tanaka et al. | |
| 2005/0079645 | A1 | 4/2005 | Moriwaka | |
| 2005/0135761 | A1 | 6/2005 | Cannon et al. | |
| 2005/0135766 | A1 * | 6/2005 | Cianciotto | G02B 6/0008 385/133 |
| 2005/0244126 | A1 | 11/2005 | Howard et al. | |
| 2005/0286123 | A1 | 12/2005 | Abu-Ageel | |
| 2007/0259467 | A1 * | 11/2007 | Tweet | H01L 31/1812 438/48 |
| 2014/0293620 | A1 * | 10/2014 | Mizuno | F21V 7/22 362/341 |

* cited by examiner

*Primary Examiner* — Sung H Pak
(74) *Attorney, Agent, or Firm* — Mueting, Raasch & Gebhardt

(57) ABSTRACT

A light beam shaper has a rectangular cavity bounded by wafer sidewalls and top and bottom caps. The top and bottom caps are wafer-bonded onto opposing surfaces of the wafer. A reflective coating covers inner surfaces of the cavity. A geometry of the cavity changes a light beam entering the cavity into a rectangular beam profile with uniform spatial intensity at the output.

23 Claims, 10 Drawing Sheets

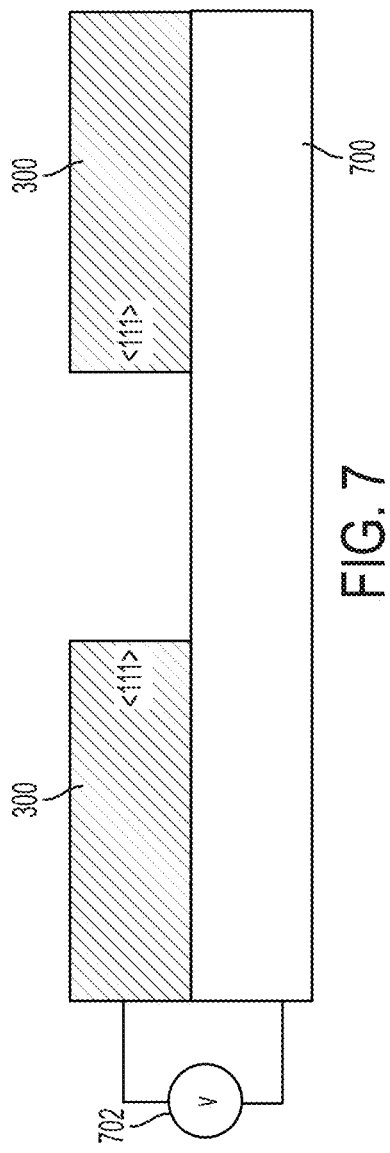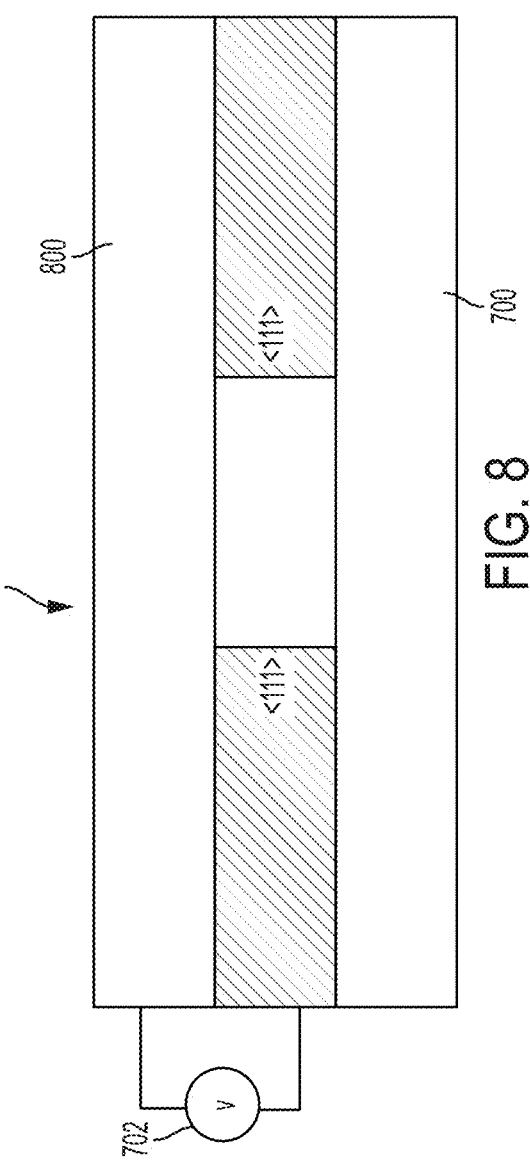

US 10,481,404 B1

RECTANGULAR CAVITY OPTICAL BEAM SHAPER AND METHOD OF MANUFACTURING THE SAME

SUMMARY

The present disclosure is directed to a rectangular cavity optical beam shaper. In one embodiment, a light beam shaper has a rectangular cavity bounded by wafer sidewalls and top and bottom caps. The top and bottom caps are wafer-bonded onto opposing surfaces of the wafer. A reflective coating covers inner surfaces of the cavity. A geometry of the cavity changes a light beam entering the cavity into a rectangular beam profile with uniform spatial intensity at the output.

In another embodiment, an article of manufacture includes a semiconductor wafer with a plurality of elongated channels separated by elongated walls. First and second wafers are bonded to opposing sides of the semiconductor wafer. The first and second wafers enclose the elongated gaps to form rectangular cavities. The semiconductor wafers and first and second wafers being diced along a plurality of parallel lines that are at a non-zero angle to a longitudinal axis of the elongated gaps to form a plurality of optical beam shapers. A reflective coating covers at least inner surfaces of the cavities of the optical beam shapers.

In another embodiment, a method involves polishing opposing surfaces of a crystalline wafer. The opposing surfaces have a first crystal orientation. A metal mask is deposited on one of the opposing surfaces. The metal mask is patterned to define openings. Elongated channels are etched in the crystalline wafer through the openings. Edges of the elongated channels form sidewalls having a second crystal orientation resulting in the sidewalls being at right angles to the opposing surfaces. First and second wafers are bonded to opposing surfaces of the crystalline wafer to form a wafer stack. The first and second wafers enclose the elongated channels. The wafer stack is diced along parallel lines that are at a non-zero angle to a longitudinal axis of the elongated channels to form a plurality of light beam shapers. The enclosed elongated channels form cavities of the light beam shapers. A reflective coating is applied to the inner surfaces of the cavities.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

FIGS. 7 and 8 are side views showing the assembly of a wafer stack according to an example embodiment;

DETAILED DESCRIPTION

The present disclosure relates to optical devices that change the shape of an input light beam profile and that distribute the power density uniformly across the output profile. These devices, sometimes referred to as optical beam shapers, receive light that has a non-uniform intensity distribution over an input cross-section of the light path. The output of the optical beam shaper has uniform intensity distribution over an output cross-section. Both input and output cross-sections are defined herein as being normal to the light propagation direction and may have any shape, e.g., circular, elliptical, square, rectangular, depending on the end-use application. In this disclosure, shapers are disclosed that provide a rectangular beam output that may be used for applications such as imaging and printing.

Figure 1:
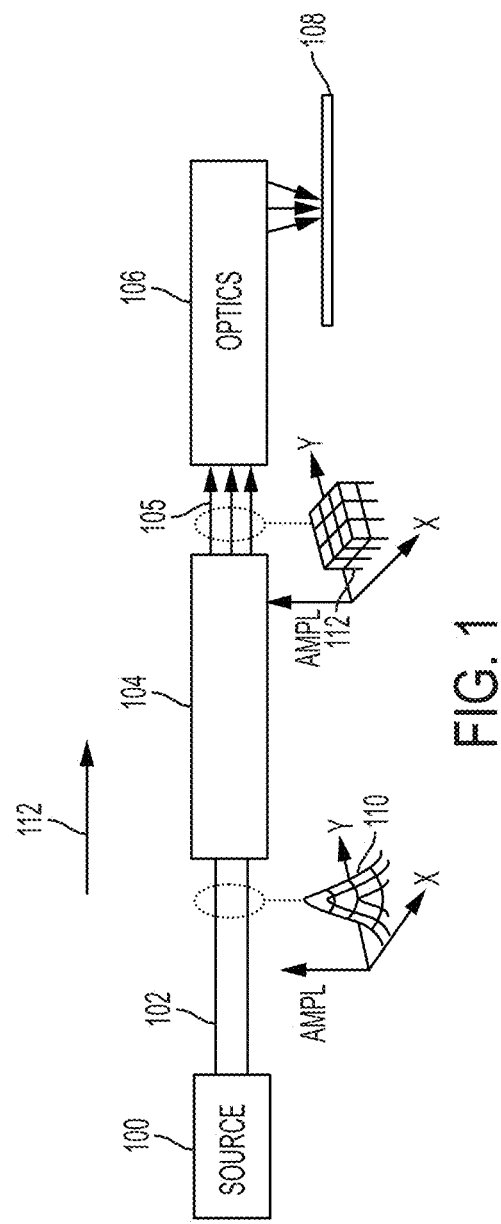
FIG. 1 is a diagram of an apparatus according to an example embodiment.

In FIG. 1, a diagram shows an example of an apparatus using an optical beam shaper according to an example embodiment. A light source 100 (e.g., a laser) couples light into a light path, here an optical fiber 102. The light propagating through the fiber 102 has a non-uniform intensity distribution defined by the optical modes of the fiber as shown by cross-sectional intensity plot 110. The distribution may be approximately a Gaussian distribution with maximum intensity at the center of the fiber 102. The light is coupled into a beam shaper 104 through which the light is internally reflected multiple times along the light propagation direction 112 of the beam shaper.

Light 105 exiting the beam shaper 104 has a uniform spatial distribution across the cross-section, as indicated by cross-sectional intensity plot 112. In this example, the rectangular output of the beam shaper 104 is different from the circular cross-section of the fiber 102. The geometry of beam shaper 104 is designed to perform the beam profile transformation with minimal optical insertion loss. The light exiting the beam shaper 104 is processed via optics section 106 for further processing, such as exposing objects or illuminating beam steering mirrors. The optics section 106 shapes and redirects the light to a media 108, e.g., a thermochromic print medium. In other embodiments, the optics section 106 may instead direct the light to a display element such as a screen or to selectively evaporate a thin liquid at a printing blanket.

Generally, for integration into an optical device, it is desirable that the beam shaper 104 be compact and low cost, yet be fabricated to tight tolerances for good optical performance. Parameters such as cavity dimensions, finish, reflectivity, etc., can have an effect on both the shape and uniformity of the light exiting the beam shaper 104, as well as alignment with other components in the apparatus that couple with the beam shaper.

Existing optical beam shapers are typically based on bulk optics, such as diffusers and fly-eye lenses. Such optical elements can be bulky, cumbersome to align, and costly. Disclosed below are micro-fabricated light beam shapers made using planar microfabrication techniques such as photolithography, chemical etching, wafer bonding, and plating. These devices can be batch fabricated in wafer scale at low cost. The devices are small, self-contained functional units, and can be easily incorporated onto the output ends of optical fiber modules.

Figure 2:
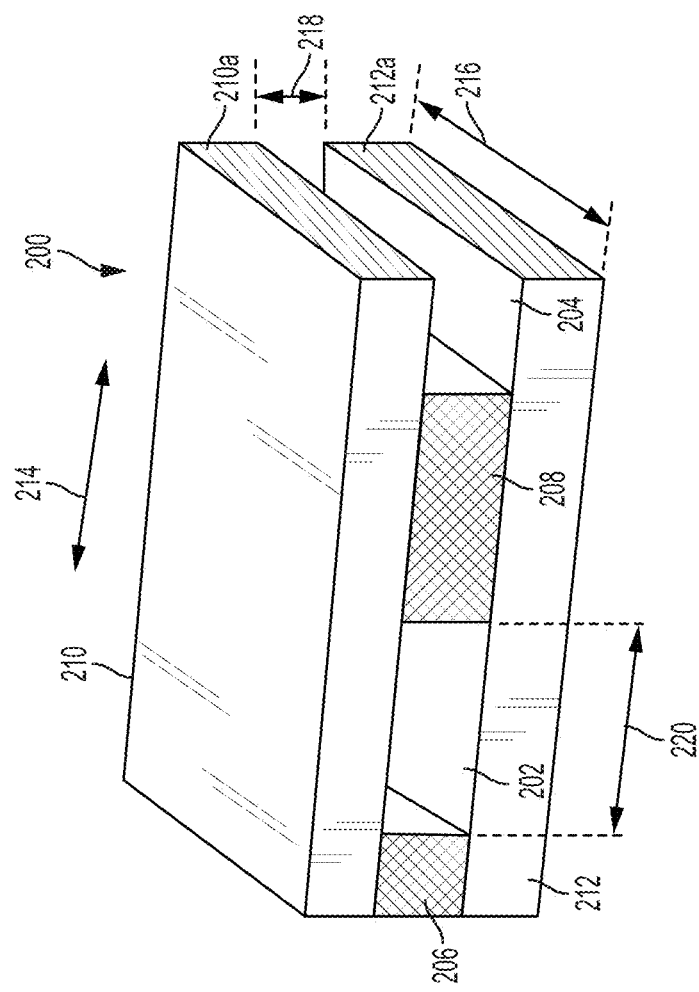
FIG. 2 is a perspective, cut-away view of an optical beam shaper according to an example embodiment.

In FIG. 2, a perspective cut-away view shows an optical beam shaper 200 according to an example embodiment. The beam shaper 200 includes hollow rectangular cavities 202, 204 bounded by crystalline semiconductor sidewalls 206, 208 and top and bottom caps 210, 212. Note that the terms "top," "bottom," "side," are used for convenience and not intended to suggest or imply a required orientation of the beam shaper 200 or any of its component parts.

In FIG. 2, the beam shaper 200 is shown cut away through surfaces 210a, 212a, such that cavity 204 is only partly shown in this figure. The top and bottom caps 210, 212 are wafer bonded onto opposing surfaces of the crystalline semiconductor sidewalls 206, 208. The inner surfaces of the cavities 202, 204 are covered in a reflective coating. Geometry of the cavities 202, 204 is designed to change a light beam entering the cavity into a rectangular beam profile with uniform spatial intensity at the output. Note that while two cavities 202, 204 are shown, the beam shaper 200 may have fewer or more cavities, and the illustrated pattern of cavities and sidewalls can extend in either sideways direction 214.

As noted above, the sidewalls 206, 208 are made of a crystalline semiconductor (e.g., Si, GaAs, InP, Ge, SiC, GaN). As will be described in detail below, this allows ensuring that the cavities 202, 204 are rectangular if formed by chemical etching, with parallel side walls and parallel top/bottom walls, as well as side walls being at right angles to the top and bottom walls. Perpendicular sidewalls can also be formed by anisotropic dry etching, such as with the use of inductively-coupled plasma etching or chemically-assisted ion beam etching. The top and bottom caps 210, 212 may be made from materials such as a semiconductor or a glass, and the top cap 210 may be made from a different material than the bottom cap 212. The reflective coating on the inside of the cavities 202, 204 may be a highly reflective metal such as Ag. Other metals such as Al or Au may be used for a reflective surface, and reflector material selection may depend, among other things, on the wavelength of light for which the beam shaper is designed. The reflector can also be a composite of metal and dielectric, such as Ag and a phase-matched dielectric over-coat, or it can be purely dielectrics, such as a multi-layer distributed Bragg reflector.

The dimensions of the cavities 202, 204 (e.g., width 220, height 218, and length 216) are selected to produce a spatially uniform output beam. These dimensions can be found, for example, using a ray tracing simulations. In one embodiment, the optimum cavity dimensions are 500 µm wide×250 µm high×5 mm long. In another embodiment, the optimum cavity dimensions are 1 mm wide×250 µm high×7.5 mm long. These design dimensions can affect the process parameters needed for making the devices. In FIGS. 3-8, a micro-fabrication process is shown that is compatible with core dimensions that are in the order of 1/100 to 20× of these dimensions.

Figure 3:
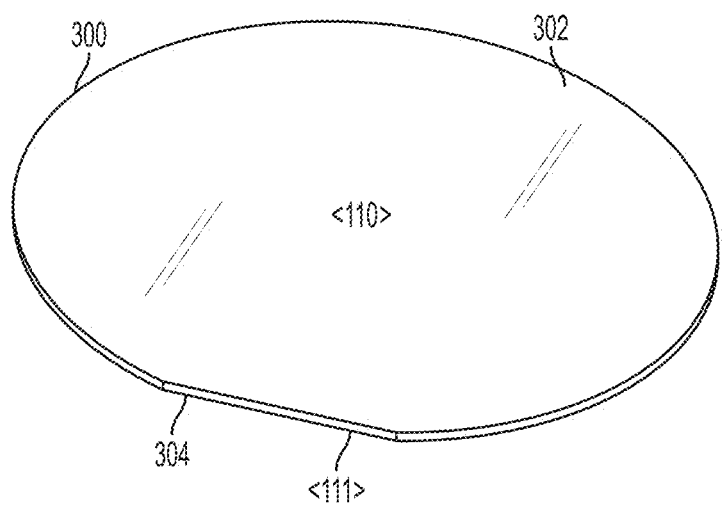
FIG. 3 is a perspective view of a crystalline wafer used to form an optical beam shaper according to an example embodiment.

The fabrication process for a beam shaper according to example embodiments takes advantage of the dependence of wet chemical etching of silicon on crystal orientation. As seen in FIG. 3, the process starts with a <110> surface-oriented silicon wafer 300, whose orientation at major surface 302 is perpendicular to the <111> crystal plane. The opposing surface (not shown) is also at the <111> crystal orientation. A reference flat edge 304 is oriented perpendicular to the <111> crystal plane. The <111> crystal plane is special because this atomic arrangement resists chemical etching much more significantly than other crystal planes. Thus, deep openings with straight sidewalls can be realized through a silicon wafer if the etched sidewalls are <111> crystal oriented, as in <110>-oriented wafers.

The first step in a micro-fabrication process is to grind and polish a <110>-oriented silicon wafer down to the designed height of the micro-shaper light guide. For the 250 µm-high channel micro-shapers described earlier, the target thickness of the thinning step will be 250 µm thick. Also, the wafer top and bottom surfaces are chemically and mechanically processed (e.g., chemical/mechanical planarization, or CMP) to achieve a mirror-like polish for successful etch masking and wafer bonding in subsequent processing steps.

Figure 4:
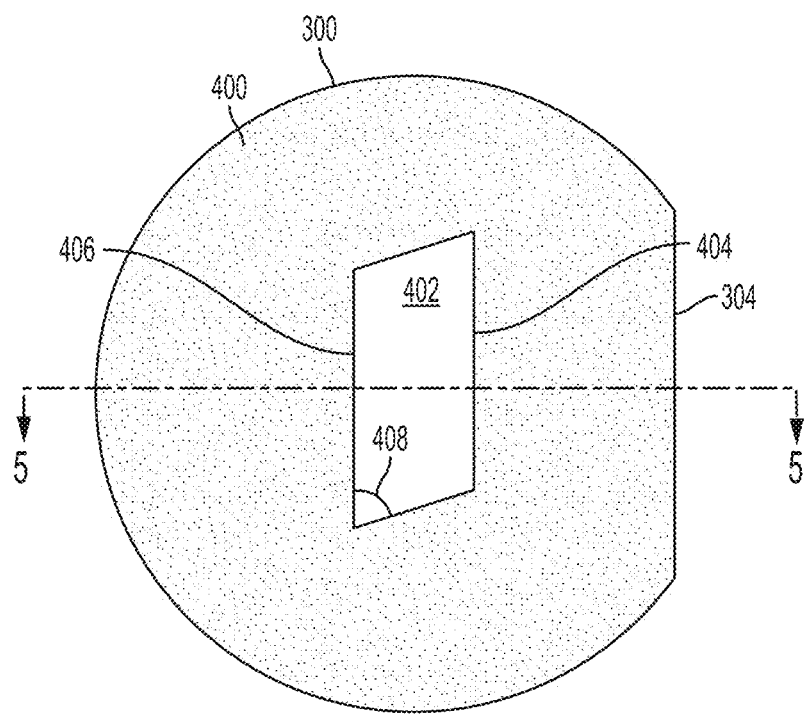
FIG. 4 is a top view of an etched crystalline wafer showing the shape of a through-wafer via according to an example embodiment.

As shown in FIG. 4, a masking material 400 is deposited on the wafer surface 302 after polishing. This material should be impervious to the aggressive chemical used for etching openings through the crystalline semiconductor wafer, should be easy to pattern and remain pin-hole-free and maintain a well-defined edge despite vigorous gas bubbles that may form during etching. A preferred masking material 400 is sputter-deposited nickel (Ni). After the chemical etching process the resulting through-wafer via is indicated by rhombus shaped opening 402. The mask pattern aligns the edges 404, 406 of the openings to the <111> direction. If the pattern is misaligned relative to the <111> edge, the subsequent wafer etch would produce jagged edges. The alignment can be aided by cleaving the wafer along its natural cleavage plane to produce the well-defined <111> reference edge 304 prior to patterning. Note that the angle 408 is imposed by crystallographic planes of the wafer.

Figure 5:
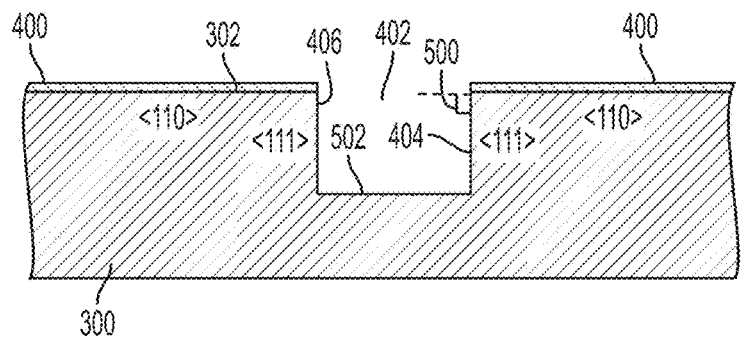
FIG. 5 is a cross-sectional view of the etched wafer shown in FIG. 4 along 4-4.

After patterning the mask 400 and removing the photoresist, the wafer is etched using, e.g., KOH, to form the through-hole opening 402. In a preferred embodiment, a KOH concentration of 45% in water at a temperature of 90° C. is used. For a Si wafer, the etch rate under this condition is about 60 µm/hour. In FIG. 5, a cross sectional view taken across section line 4-4 in FIG. 3 shows additional details of the wafer 300 after the Si etch. The angle between the <110> crystal plane of the top surface 302 and the <111> crystal plane of the edges 404, 406 results in a 90° angle 500 between the top surface 302 and edges 404, 406. This results in the sidewalls of the resulting beam shaper being at 90° to the top and bottom caps that are added in subsequent processing steps. This also results in the edges 404, 406 (as seen in FIG. 4) being straight, thereby forming straight sidewalls along the light propagation direction of the beam shaper. Note that the opening 402 may be cut partially through the wafer 300 as shown (e.g., such that bottom surface 502 forms one of the caps), or may be cut all the way through.

In an alternative embodiment, the through-hole opening is formed by dry etching, where the slope of the sidewalls are defined by dry etching parameters such as pressure, plasma density, plasma species, RF power, or ion energy, rather than by the crystal orientation of the wafer. In this alternative embodiment, straight sidewalls can be realized even for non-<110> oriented wafers.

Figure 6:
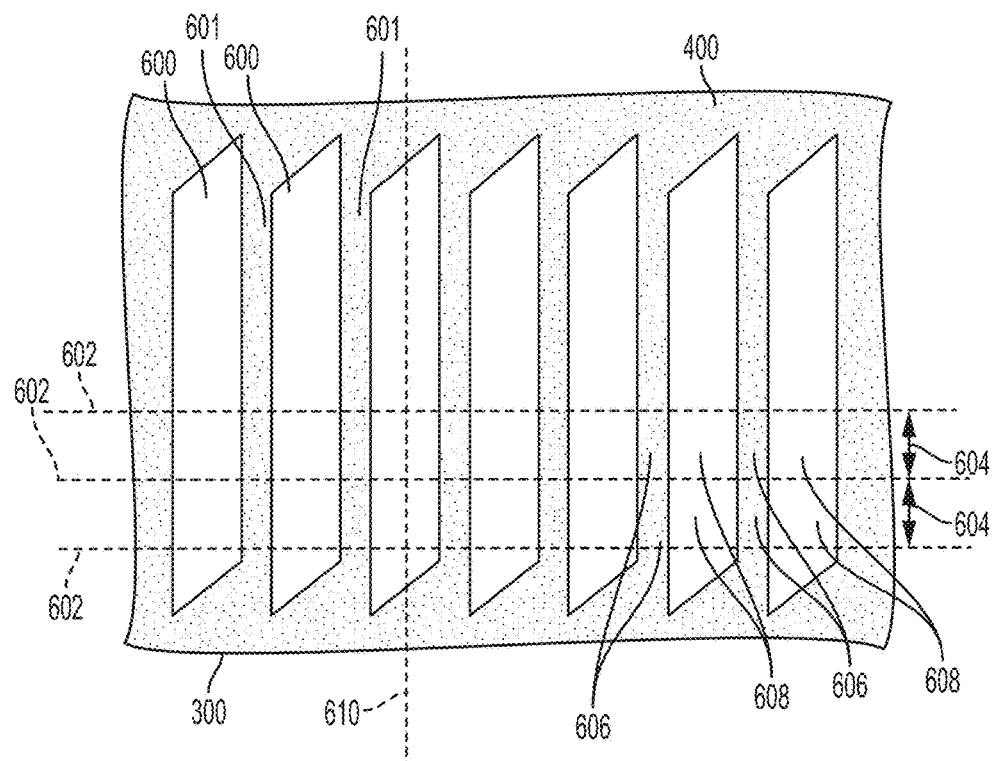
FIG. 6 is a top view of multiple-channel pattern according to another example embodiment.

In FIG. 6, a diagram shows an example of a multiple-channel pattern used in mass producing of beam shapers according to an example embodiment. Multiple elongated channels 600 separated by elongated walls 601 are formed by patterning and etching though crystalline wafer 300 described above. As indicated by parallel lines 602, the wafer 300 will be diced at a right angle to a longitudinal axis 610 of the channels 600 at a later stage of production. Note that in some cases the dicing lanes 602 may be at a non-zero angle other than 90 degrees to the longitudinal axis 610, e.g., if a beam shaper with cavities staggered along the light propagation direction is desired. The dicing lanes 602 are spaced apart by a distance 604 corresponding to the cavity length of the beam shaper (e.g., length 216 shown in FIG. 2). Regions 606 between the dicing lanes 602 and between the channels 600 will form sidewalls of the beam shapers. The regions 608 of the channels 600 between the dicing lanes 602 will correspond to the cavities of the beam shapers.

After the partial or through-hole etching process, the mask 400 is removed by chemical etching. The top and bottom surfaces of the silicon wafer 300 are then capped with planar wafers. An example of this is shown in the diagrams of FIGS. 7 and 8. First and second wafers 700, 800 (e.g. glass wafers, semiconductor wafers) are sandwiched around the etched openings on the silicon wafer 300, and these wafers 700, 800 form the upper and lower surfaces of the enclosed cavities.

In one embodiment, the interfaces between the silicon 300 and first and second wafers 700, 800 are formed by direct wafer bonding using an anodic bonding process. In one embodiment, the bonding process involves heating wafer pairs to about 350° C., and applying about 600 V across the interface, as indicated by voltage source 702. The elevated temperature and high voltage induce ions to migrate across the interface between the two materials, causing formation of ionic bonds that bind the two surfaces together, forming stack 802 after both wafers 700, 800 have been bonded. Ideally, the thermal expansion coefficient of the cap wafers are similar to wafer 300. Typical glass has thermal expansion coefficient that is about 3 times as large as that of silicon at room temperature. The difference in thermal expansion coefficient can be accommodated if the bond strength is strong enough to hold the stress, but could lead to delamination or cracking if the stress becomes too large. We only consider cap materials whose thermal expansion coefficient is less than 30 times that of the base wafer. A preferred embodiment utilizes fluoroboric glass 700, 800 wafers for strong and reliable anodic bonds. In another embodiment the top and bottom wafers 700, 800 are polished silicon wafers. Wafer bonding can achieved, for example, by using fusion bonding of oxidized wafer surfaces or thermo-compression bonding of metal layers deposited on the silicon wafers.

Figure 9:
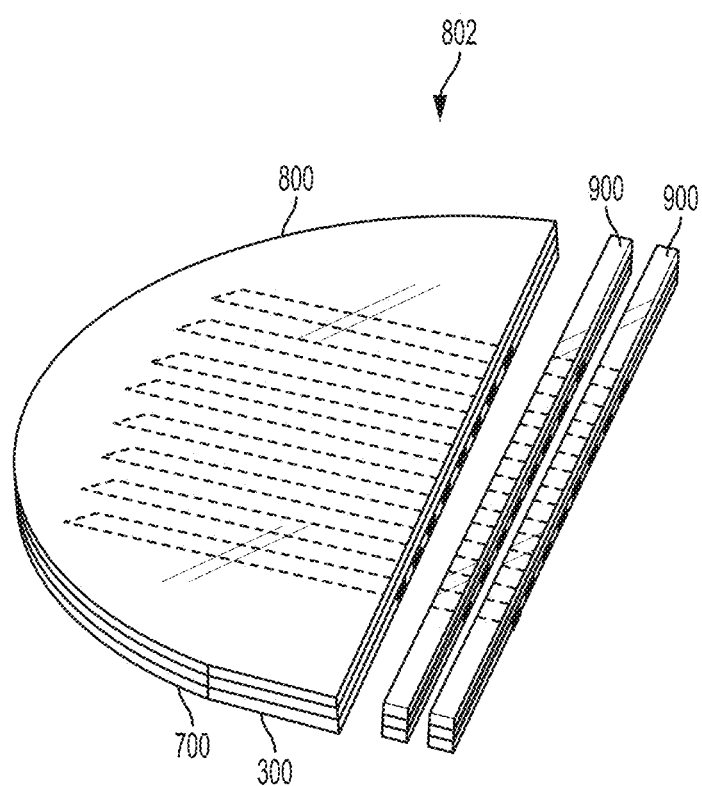
FIG. 9 is a perspective view showing the dicing of a wafer stack according to an example embodiment.
Figure 10:
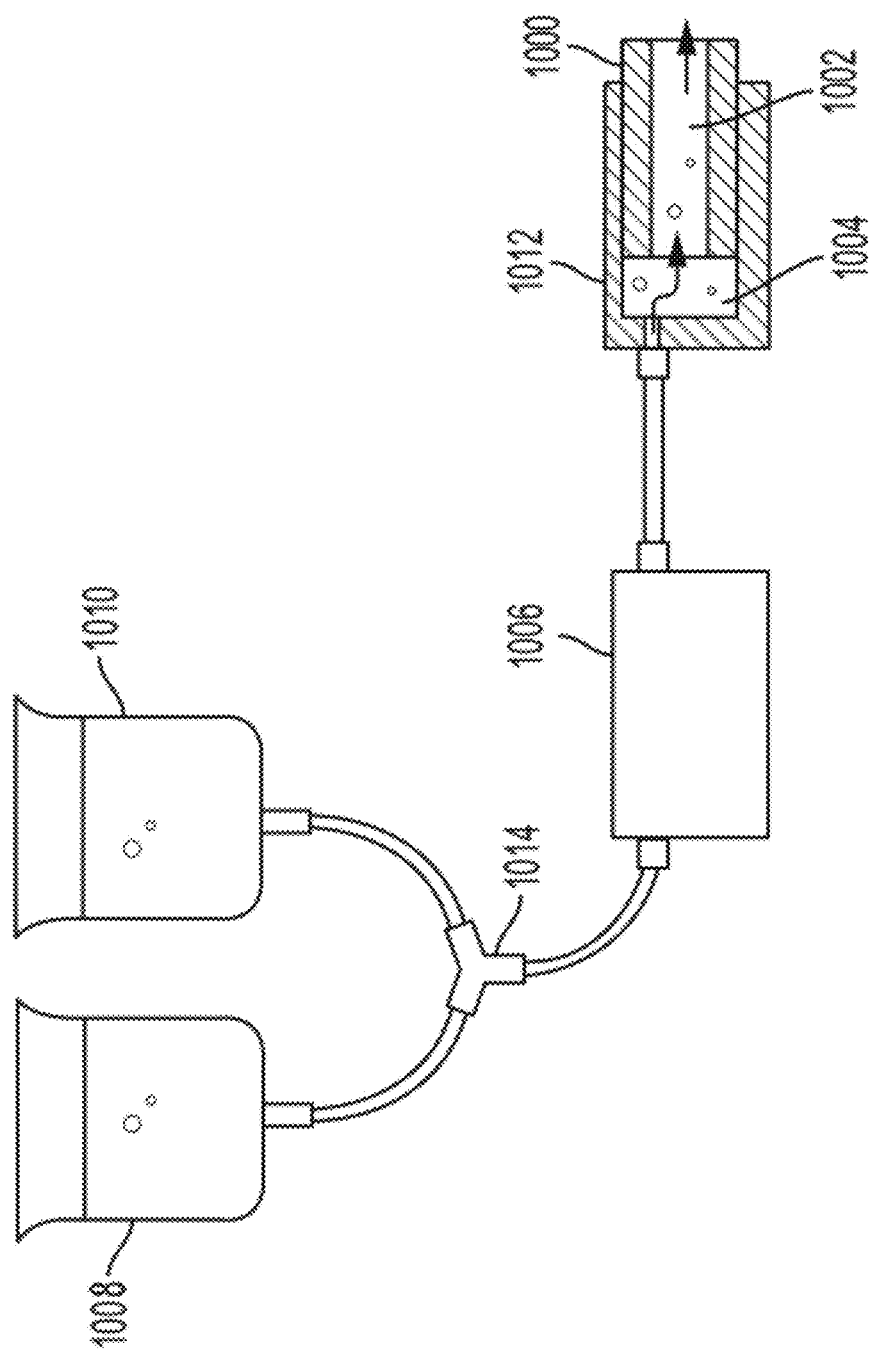
FIG. 10 is an illustration of a system used to create reflective coatings for beam shaper cavities according to an example embodiment.

As shown in the perspective view of FIG. 9, the next step involves saw-cutting the wafer stack 802 along the previously described dicing lanes to form strips 900 of microchannels. The separation between dicing lanes (e.g., distance 604 in FIG. 6) defines the cavity lengths. For the two embodiments described above, these lengths are 5 mm and 7.5 mm. The strips 900 may be further cut lengthwise, e.g., to form multiple beam shapers, to remove excess material from the ends, etc. After saw-cutting the wafer stack 802 into strips 900, the cavities within the sets 900 are coated with a reflective material, as shown in the diagram of FIG. 10. The coating generally involves flowing an electroless silver plating solution 1004 through the hollow channels 1002 of a beam shaper 1000. The chemicals react with the sidewalls, which results in the deposition of highly reflective silver metal on the walls.

The plating chemical 1004 in one embodiment includes a two-component solution that is mixed together just before being forced through the cavities 1002 via a peristatic pump 1006. One of the two components is a AgNO3 solution 1008 prepared by mixing 3 ml of 0.1 M AgNO3 with 1 ml of 0.8 M KOH and dropping NH4OH until the formed brown precipitates dissolve. This mixture is poured into a 50 ml syringe and diluted with 50 cc of hot deionized water to fill the syringe. The other component 1010 is 2 ml of 0.5 M dextrose poured into a 50 ml syringe and diluted with 50 cc of DI water to fill the syringe. It will be understood that the solutions 1008, 1010 can be prepared in any quantities by scaling the ingredients proportionally.

The beam shaper is held in a fixture 1012 while the peristaltic pump 1006 forces the plating solution through the narrow channels at a controlled flow rate of 11 ml/min for 2 min. The two chemical components 1008, 1010 are mixed at junction 1014 right before being pushed through the cavities 1002. If the components 1008, 1010 are pre-mixed earlier, excessive pre-reaction could occur causing silver plating on fixtures and tubings. The process is self-terminating and results in the deposition of about 200 nm of plated silver on the cavity sidewalls.

Figure 11:
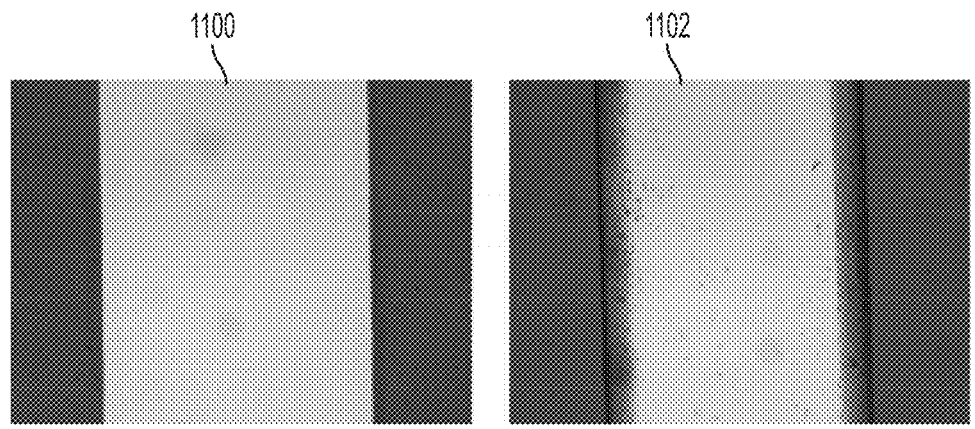
FIG. 11 is a set of top-view optical micrograph images of optical beam shaper cavities showing results of different plating processes according to example embodiments.

In one embodiment, the coating process employs an initial sensitization step, where the cavity sidewalls are treated with a 1.55 mM solution of SnCl2 for two minutes prior to plating to improve coating uniformity. In FIG. 11, optical micrograph images 1100, 1102 of a top view of optical beam shaper cavities (looking through one of the glass caps) show results of different plating processes. Image 1100 is of a cavity coated using the initial sensitization, and indicates very uniform silver coating. In contrast, image 1102 shows the coating result without this sensitization, which produces a non-uniform coating with many pinholes.

To protect the coated silver reflector from oxidizing, the reflector can be further coated with a polymer such as polystyrene, which is transparent at visible and near infrared wavelengths. The polystyrene coating can be deposited by flowing polystyrene solution in 3% weight toluene through the channels after the silver plating step. The thickness of the polystyrene can be designed to phase match the wavelength of interest to achieve enhanced reflectivity compared to the reflectivity of metal alone. In other embodiments, the cavities of the beam shapers may be completely filled with a transparent material, e.g., to both protect the silver coating and to prevent contaminants from entering the channel.

Figure 12:
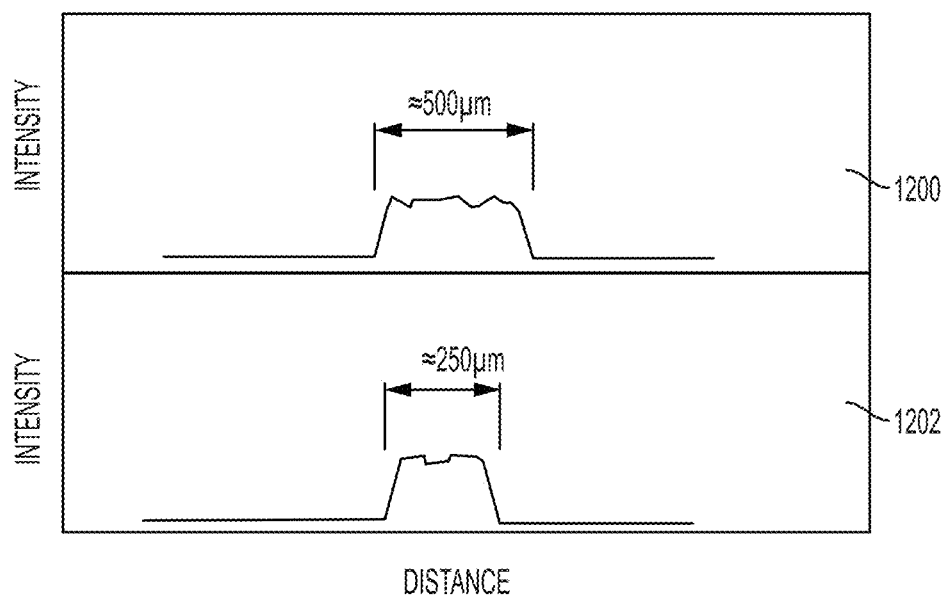
FIG. 12 is a set of beam profile graphs showing measured performance of a beam shaper according to an example embodiment.

The optical performance of the micro-optical beam shaper in operation was characterized by laboratory measurement. The characteristics of the input light are typical of outputs from an optical fiber and possess a circular beam profile that tapers off gradually near the perimeter. The micro-shaper transforms the beam into a rectangular-shaped profile, in this case having a 250 μm high by 500 μm wide cavity. The plots 1200 and 1202 in FIG. 12 show the intensity profile as a function of position across the center of the device in both horizontal direction (plot 1200) and vertical direction (plot 1202), indicating good uniformity. For example, the spatial amplitude profile for such a device may vary by no more than 35% at an exit end of the cavity, and in this case the variance is significantly less than 35%.

Figure 13:
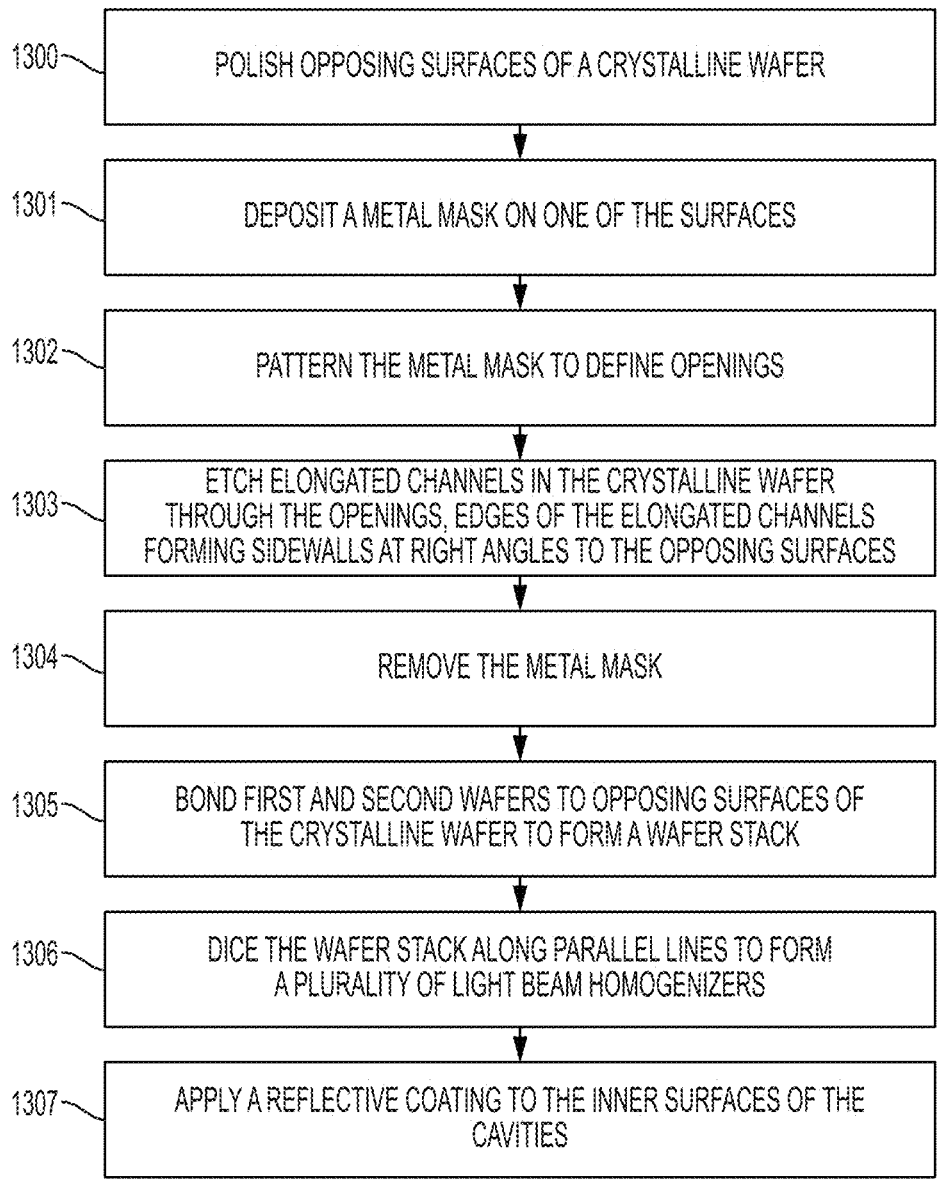
FIG. 13 is a flowchart of a method according to an example embodiment.

In FIG. 13, a flowchart shows a method according to an example embodiment. The method involves polishing 1300 opposing surfaces of a crystalline wafer. The opposing surfaces having a first crystal orientation, e.g., a <110> crystal orientation for a silicon wafer. A metal mask is deposited 1301 on the surfaces of the wafer. The metal mask is patterned 1302 to define openings, and elongated channels are etched 1303 in the crystalline wafer through the openings. Edges of the elongated channels form sidewalls having a second crystal orientation (e.g., a <111> crystal orientation for a silicon wafer) resulting in the sidewalls being at right angles to the opposing surfaces. The metal mask is then optionally removed 1304.

The first and second wafers are bonded 1305 to opposing surfaces of the crystalline wafer to form a wafer stack. The first and second wafers enclose the elongated channels. The wafer stack is diced 1306 along parallel lines that are at a non-zero angle to a longitudinal axis of the elongated channels to form a plurality of light beam shapers. The enclosed elongated channels form cavities of the light beam shapers. A reflective coating is applied 1307 to the inner surfaces of the cavities.

Figure 14:
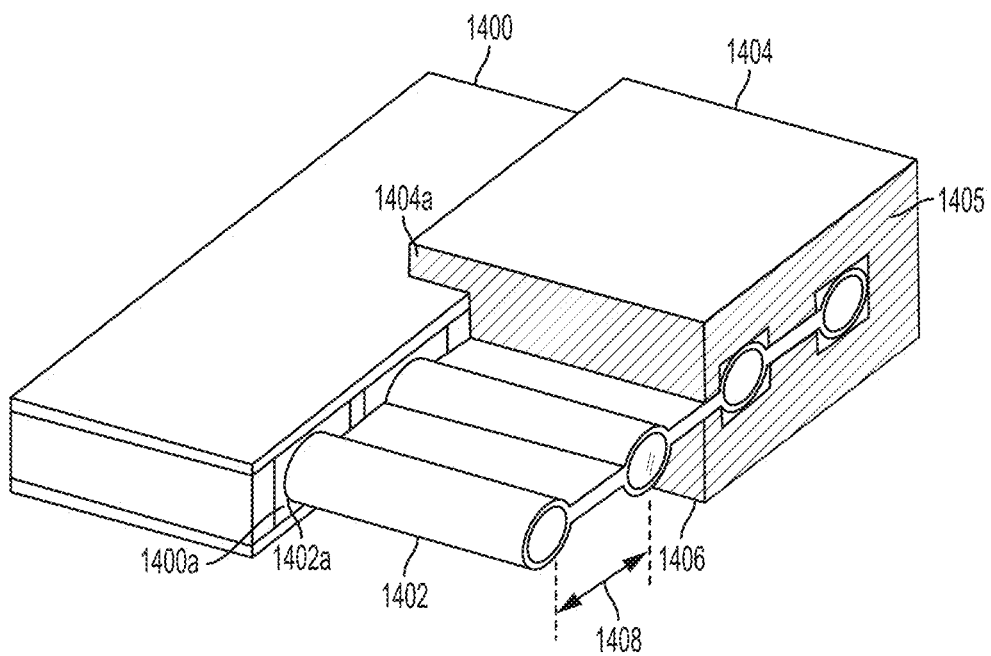
FIGS. 14 and 15 are perspective and top views, respectively, of an optical assembly utilizing a beam shaper according to an example embodiment.
Figure 15:
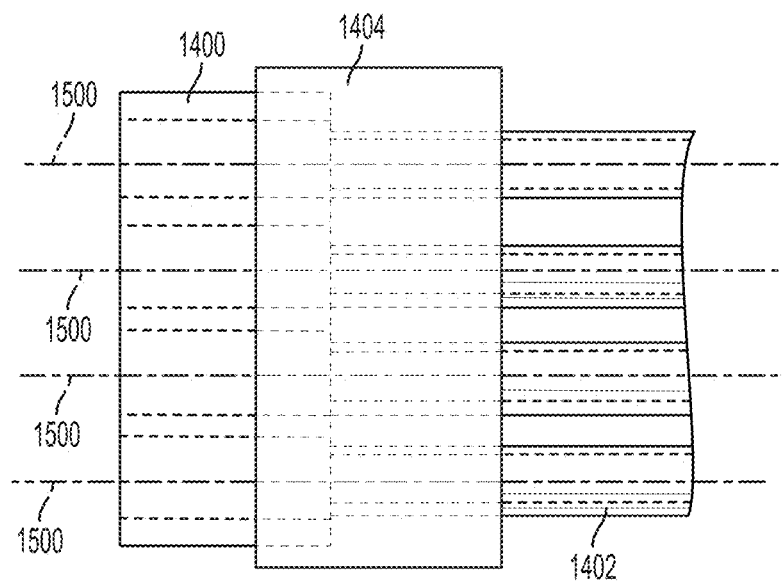

A micro-optical beam shaper can be integrated with optical carriers (e.g., waveguides, fibers) to form an integrated unit. In FIGS. 14 and 15, an integrated optical unit using an optical beam shaper 1400 according to an example embodiment is shown. In FIG. 14, a fiber optic cable array 1402 is held to the beam shaper 1400 via coupler 1404. The coupler 1404 and fiber optic cable array 1402 are shown cut away along plane 1405, and the coupler 1404 is shown also cut away along plane 1406. The pitch 1408 of the fiber optic cable array 1402 corresponds to the center-to-center spacing of the cavities of the optical beam shaper 1400 such that each output facet 1402*a* is mechanically held and aligned to the center of one of the corresponding cavities 1400*a*.

As seen in the top view of FIG. 15, the common pitch 1408 results in the fibers and the cavities having common centerlines 1500 when attached via the coupler 1404. The coupler 1404 includes features (e.g., circumferential ridge 1404*a*) that mechanically secures and positively aligns the fiber optic cable array 1402 with the optical beam shaper 1400. The coupler 1404 may be removably attached to the optical beam shaper 1400 via latches, snaps, etc., or permanently attached via bonding. An integrated optical unit according to various embodiments can comprise a single optical fiber, a linear array of fibers as illustrated in FIGS. 14 and 15, or a two-dimensional array of fibers coupled to a stack of micro-optical beam shapers.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A light beam shaper, comprising,
a wafer of crystalline semiconductor comprising a plurality of elongated channels separated by a plurality of elongated walls, the wafer being diced along a plurality of parallel lines that are at a non-zero angle to a longitudinal axis of the elongated channels such that the diced elongated walls form a plurality of wafer sidewalls;
top and bottom caps wafer-bonded onto opposing surfaces of the wafer to form a rectangular cavity bounded by two of the wafer sidewalls; and
a reflective coating on inner surfaces of the cavity, wherein a geometry of the cavity changes a light beam entering the cavity into a rectangular beam profile.

2. The light beam shaper of claim 1, wherein the opposing surfaces of the wafer have a crystalline orientation of <110> and surfaces of the wafer sidewalls facing the rectangular cavity have a <111> crystal orientation.

3. The light beam shaper of claim 1, wherein at least one of the top and bottom caps has a thermal expansion coefficient that is less than 30 times a thermal expansion coefficient of the wafer.

4. The light beam shaper of claim 1, wherein at least one of the top and bottom caps comprises at least one of glass, semiconductor, polymer, and metal.

5. The light beam shaper of claim 4, wherein the glass comprises a fluoroboric glass.

6. The light beam shaper of claim 1, wherein the reflective coating comprises one or both of a metal and a dielectric.

7. The light beam shaper of claim 6, wherein the reflective coating comprises the metal overcoated by the dielectric, the dielectric being phase-matched to a wavelength of the light beam.

8. The light beam shaper of claim 6, wherein the reflective coating comprises the metal overcoated by polystyrene.

9. The light beam shaper of claim 6, wherein the dielectric completely fills the cavity.

10. The light beam shaper of claim 1, wherein light coupled into an entry end of the cavity exits with a spatial intensity profile that varies by no more than 35% at an exit end of the cavity.

11. The light beam shaper of claim 1, wherein sides of the wafer sidewalls have a thickness that defines a height of the cavity, the thickness being less than 600 μm.

12. An optical assembly comprising:
the light beam shaper of claim 1;
optical fiber; and
a coupler that aligns the optical fiber to a center of the cavity of the light beam shaper and mechanically secures the optical fiber to the light beam shaper.

13. An article of manufacture, comprising:
a semiconductor wafer comprising a plurality of elongated channels separated by elongated walls;
first and second wafers bonded to opposing sides of the semiconductor wafer, the first and second wafers enclosing the elongated channels to form rectangular cavities, the semiconductor wafer and first and second wafers being diced along a plurality of parallel lines that are at a non-zero angle to a longitudinal axis of the elongated channels to form a plurality of optical beam shapers; and
a reflective coating on at least inner surfaces of the cavities of the optical beam shapers.

14. The article of manufacture of claim 13, wherein the semiconductor wafer comprises crystalline Si with the opposing surfaces having a crystalline orientation of <110>.

15. A method, comprising:
polishing opposing surfaces of a crystalline wafer, the opposing surfaces having a first crystal orientation;
depositing a mask on one of the opposing surfaces;
patterning the mask to define openings;
etching elongated channels in the crystalline wafer through the openings, edges of the elongated channels forming sidewalls having a second crystal orientation resulting in the sidewalls being at right angles to the opposing surfaces;
removing the mask;
bonding first and second wafers to opposing surfaces of the crystalline wafer to form a wafer stack, the first and second wafers enclosing the elongated channels;
dicing the wafer stack along parallel lines that are at a non-zero angle to a longitudinal axis of the elongated channels to form a plurality of light beam shapers, the enclosed elongated channels forming cavities of the light beam shapers; and
applying a reflective coating to the inner surfaces of the cavities.

16. The method of claim 15, wherein the bonding of the first and second wafers to the opposing surfaces of the crystalline wafer comprises anodic bonding.

17. The method of claim 15, wherein the mask comprises Ni.

18. The method of claim 15, wherein the elongated channels are etched with KOH.

19. The method of claim 15, wherein applying the reflective coating comprises flowing an $AgNO_3$ solution through the cavities of the optical beam shapers.

20. The method of claim 19, where applying the reflective coating further comprises flowing a $SnCl_2$ solution through the cavities before flowing the $AgNO_3$ solution.

21. The method of claim 15, further comprising applying a transparent polymer coating to the reflective coating.

22. The method of claim 15, wherein etching the elongated channels in the crystalline wafer comprises dry etching.

23. The light beam shaper of claim 1, wherein the top and bottom caps are anodically wafer-bonded onto the opposing surfaces of the wafer.

* * * * *